(12) United States Patent
Katata

(10) Patent No.: US 6,521,010 B1
(45) Date of Patent: Feb. 18, 2003

(54) FILTER, FILTERING FRAME, AND SEMICONDUCTOR DEVICE MANUFACTURING METHOD AND APPARATUS

(75) Inventor: Tomio Katata, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/662,838

(22) Filed: Sep. 15, 2000

(30) Foreign Application Priority Data

Sep. 16, 1999  (JP) .......................................... 11-262711

(51) Int. Cl.$^7$ .......................... B01D 45/00; C23C 14/34
(52) U.S. Cl. .............................. 55/434; 55/445; 55/490; 55/529; 204/192.12; 204/298.11
(58) Field of Search .................. 55/307, 308, 392, 55/434, 440, 442, 443, 444, 445, 446, 463, 464, 465, 490, 529; 96/390, 392, 393, 267; 204/192.12, 298.11, 297.05; 427/272, 282

(56) References Cited

U.S. PATENT DOCUMENTS

| | | | | |
|---|---|---|---|---|
| 1,970,488 A | * | 8/1934 | Butts ............................ | 55/307 |
| 3,957,465 A | * | 5/1976 | Pircon ........................... | 55/242 |
| 4,235,606 A | * | 11/1980 | Becker et al. ................. | 55/434 |
| 5,041,146 A | * | 8/1991 | Simmerlein-Erlbacher ... | 55/444 |
| 5,223,108 A | * | 6/1993 | Hurwitt .................. | 204/198.11 |
| 5,405,652 A | * | 4/1995 | Kashiwagi et al. .... | 204/298.11 |
| 5,672,252 A | * | 9/1997 | Hayashi et al. ........ | 204/192.12 |
| 5,980,702 A | * | 11/1999 | Parker .................... | 204/298.11 |
| 5,993,904 A | * | 11/1999 | Boucher ................. | 204/298.11 |
| 6,010,554 A | * | 1/2000 | Birmingham et al. ......... | 55/444 |
| 6,135,367 A | * | 10/2000 | Hsu ........................... | 55/442 |
| 6,217,730 B1 | * | 4/2001 | Nakajima et al. ...... | 204/298.11 |

FOREIGN PATENT DOCUMENTS

| | | |
|---|---|---|
| JP | 4-6271 | 1/1992 |
| JP | 10-121235 | 5/1998 |
| JP | 11-131228 | * 5/1999 |

* cited by examiner

*Primary Examiner*—Duane Smith
*Assistant Examiner*—Jason M. Greene
(74) *Attorney, Agent, or Firm*—Finnegan, Henderson, Farabow, Garrett & Dunner, L.L.P.

(57) ABSTRACT

A semiconductor device manufacturing apparatus employs filters. The filters have openings whose diameters are reduced in proportion to the distances of the filters from cathodes. This arrangement improves the directivity of sputtered particles and evenly distributes particles among the filters to form thin films on the filters. The peripheries of the openings on the filters are curved toward the cathodes, to increase a particle catching area of each filter and thin a film to be formed on each filter. Even if the films on the filters peel off, they never go beyond the curved peripheries of the filters and never drop onto a substrate from which semiconductor devices are produced.

6 Claims, 10 Drawing Sheets

FILTER, FILTERING FRAME, AND SEMICONDUCTOR DEVICE MANUFACTURING METHOD AND APPARATUS

CROSS REFERENCE TO RELATED APPLICATIONS

The subject application is related to subject matter disclosed in Japanese Patent Application No. Hei 11-262711 filed on Sep. 16, 1999 in Japan to which the subject application claims priority under the Paris Convention and which is incorporated by reference herein.

BACKGROUND OF THE INVENTION

1. Field of the Invention

The present invention relates to semiconductor device manufacturing apparatuses employing a PVD method, such as sputtering apparatuses and vacuum evaporation apparatuses. In particular, the present invention relates to a multicathode sputtering apparatus capable of reducing the cleaning frequency of filters, the filters themselves, a filtering frame, a semiconductor device manufacturing method, and a semiconductor device manufacturing apparatus.

2. Description of the Related Art

In the field of semiconductor devices, ground rules are becoming finer and the number of interconnection layers is increasing, to increase the aspect ratio (depth to diameter) of each via hole. As a result, a standard sputtering technique finds difficulty to fill such high-aspect-ratio via holes. To cope with this problem, there is a long-throw sputtering technique that elongates the distance between a target and a substrate and forms a film on the substrate only with particles that are straightly sputtered from the target toward the substrate. This technique is capable of correctly forming films in via holes and securing a sufficient coverage of each film. This technique, however, has a problem of causing asymmetry among films in via holes located along the periphery of a substrate and a problem of hardly forming a uniform film over the surface of a substrate. The larger the diameters of substrates or silicon wafers, the more the problems of asymmetry and unevenness become serious. To solve these problems, Japanese Unexamined Patent Publications Hei 10-121235 and Hei 11-29859 propose a multicathode sputtering apparatus that arranges a plurality of cathodes and corresponding targets in a chamber. This apparatus employs filters that pass only vertically oriented particles to form a film on a substrate, thereby improving the overall uniformity of the film.

FIG. 1 shows a film forming state of a multicathode sputtering apparatus according to a prior art. A chamber 5 accommodates targets 41 to 43 that are attached to cathodes, respectively. The targets 41 to 43 face a substrate 8 with filters 71 to 73 interposing between them. The filters 71 to 73 have openings corresponding to the targets 41 to 43, respectively. The diameter of each opening is greater than the diameter of the target. The chamber 5 has an outlet 6 connected to a vacuum pump (not shown).

To form a film on the substrate 8, the chamber 5 is evacuated to a predetermined pressure, and argon gas is introduced into the chamber 5 through an inlet 7 to a sputtering pressure. Power sources 61 to 63 apply predetermined power to the cathodes to produce plasma on the targets 41 to 43 to sputter particles from the targets 41 to 43. The sputtered particles pass through the openings of the filters 71 to 73 and deposit on the substrate 8.

The sputtered particles linearly advance from the targets 41 to 43 according to the cosine rule at any angles with respect to normal lines extended from the targets. Particles of large angles hit and deposit on the filters 71 to 73 without reaching the substrate 8. Only geometrically reachable particles arrive at the substrate 8 and deposit thereon to form a film, thereby suppressing overhangs on steps and via holes, improving the coverage of the film over the substrate 8, and eliminating asymmetry in the film. By individually changing the power to the cathodes, the uniformity of a film on the substrate 8 may be improved.

This prior art, however, deposits particles around the openings of only the filter 71 that is closest to the cathodes, among the filters 71 to 73. When the particles on the filter 71 exceed a certain thickness, they peel off the filter 71 and drop onto the substrate 8, to form clusters of particles on the substrate 8. To avoid this, the prior art must frequently wash the filter 71, which deteriorates the mean time between maintenances of the apparatus. The peeling problem frequently occurs when forming titanium nitride (TiN) films or tantalum nitride (TaN) films, to greatly deteriorate productivity.

SUMMARY OF THE INVENTION

An object of the present invention is to provide a filter capable of minimizing particles depositing thereon.

Another object of the present invention is to provide a filter capable of preventing particles peeled off the same from dropping onto a substrate.

Still another object of the present invention is to provide a filtering frame capable of minimizing particles depositing thereon.

Still another object of the present invention is to provide a filtering frame capable of preventing particles peeled off the same from dropping onto a substrate.

Still another object of the present invention is to provide a semiconductor device manufacturing apparatus capable of minimizing particles depositing on filters.

Still another object of the present invention is to provide a semiconductor device manufacturing apparatus capable of preventing particles peeled off filters from dropping onto a substrate.

Still another object of the present invention is to provide a semiconductor device manufacturing method capable of minimizing particles depositing on filters.

In order to accomplish the objects, a first aspect of the present invention provides a filter having a flat plate with circular openings and a funnel provided for each of the openings. Each funnel has a bottom opening matching with the plate opening and a top opening smaller than the bottom opening. A normal line extended from the center of the top opening coincides with a normal line extended from the center of the bottom opening and is in parallel with a normal line extended from the plate. Sputtered particles deposit on an outer face of each funnel. Since sputtered face is wide, the deposited particles spread into a thin film. This elongates a time to cause the peeling of the film off the funnels, prevents the formation of clusters of particles on a substrate, and extends the life of the filter. Even if the film on the funnels peels off, it will stay on the filter because the peeled film is unable to go beyond the funnels. Accordingly, no peeled film drops onto the substrate. Each funnel passes particles sputtered from only an overhead target and blocks particles sputtered from adjacent targets. This improves the directivity of sputtered particles to form a uniform film on the substrate. For each funnel, particles sputtered from adjacent targets except an overhead target hit the outer face of the funnel substantially at a right angle, and therefore, the particles deposited on the funnel strongly adhere thereto and hardly peel off.

According to the first aspect, the bottom openings of adjacent funnels may partly overlap one another, and the overlapping parts of the adjacent funnels may be cut. This arrangement enables the distance between adjacent targets to be freely set without regard to the dimensions of the funnels.

According to the first aspect, the flat plate may be a flat disk so that the filter may easily be rotated in a sputtering apparatus to improve the uniformity of a film formed on a substrate.

A second aspect of the present invention provides a filtering frame having a first filter made of a flat plate having first circular openings, and a second filter that is in parallel with the first filter and has second circular openings corresponding to the first openings, respectively, the diameter of the second openings being smaller than that of the first openings, normal lines extended from the centers of each pair of the first and second openings coinciding with each other. The filtering frame is installed in a sputtering apparatus such that the first filter is closer to cathodes than the second filter. With this arrangement, the first and second filters may uniformly catch sputtered particles, to increase the number of substrates processible before the particles caught by the filters start to peel off and extend the washing intervals of the filters.

According to the second aspect, the first and second filters may be disks having the same diameter with normal lines extended from the centers of the filters coinciding with each other. The filtering frame is rotatable in a sputtering apparatus, to form a uniform film on a substrate from sputtered particles.

According to the second aspect, the filtering frame may further have a third filter opposing to the first filter with the second filter interposing between them. The third filter has third circular openings corresponding to the second openings, respectively. The diameter of the third openings is smaller than that of the second openings. Normal lines extended from the centers of each pair of the second and third openings coincide with each other. Particles caught by the first to third filters are uniformly distributed among them, to further increase the number of substrates processible before the particles caught by the filters start to peel off.

According to the second aspect, the first filter may have first funnels. The first funnels are provided for the first openings, respectively, and have each circular top and bottom openings. The bottom opening is larger than the top opening, is equal to the first opening, and is fitted to the first opening. Normal lines extended from the top, bottom, and first openings coincide with one another. The second filter may have second funnels. The second funnels are provided for the second openings, respectively, and have each circular top and bottom openings. The bottom opening is larger than the top opening, is equal to the second opening, and is fitted to the second opening. The top opening of the second funnel is smaller than the top opening of the first funnel. Normal lines extended from the top and bottom openings of a pair of the first and second funnels coincide with one another. Sputtered particles deposit on the first and second funnels and spread into thin films. This results in elongating a time to cause the peeling of the thin films off the funnels, preventing clusters of particles to be formed on a substrate, and extending the lives of the filters. Even if the films peel off, they hardly go beyond the funnels. Namely, the peeled films may stay on the filters and may not drop onto a substrate. Each funnel passes particles sputtered from an overhead target and blocks particles sputtered from adjacent targets. This improves the directivity of sputtered particles to form a uniform film on a substrate. For each funnel, particles sputtered from adjacent targets except an overhead target hit the outer face of the funnel substantially at a right angle, and therefore, the particles deposited on the funnel strongly adhere thereto and hardly peel off. The openings on the filters are gradually scaled down from those on the filter closest to cathodes toward those on the filter farthest from the cathodes, to uniformly distribute caught particles among the filters. This improves the number of substrates processible before the particles caught by the filters start to peel off.

A third aspect of the present invention provides a semiconductor device manufacturing apparatus. The apparatus has a vacuum chamber, cathodes arranged in the vacuum chamber, disk targets arranged on the bottoms of the cathodes with the bottoms of the targets being flush with a plane, and at least two filters arranged under the targets. Each of the filters has openings corresponding to the targets, respectively, and being flush with a plane that is in parallel with the plane the targets are flush with, the diameters of the openings being decreased in order of the distances of the filters from the targets. Namely, the diameters of the openings on the filters gradually become smaller as they are separated from the cathodes. As a result, particles caught by the filters are uniformly distributed among the filters, to increase the number of substrates processible before the particles on the filters start to peel off, compared with the prior art that employs openings of the same diameter. The third aspect, therefore, extends the washing intervals of the filters.

According to the third aspect, the semiconductor device manufacturing apparatus may consist of a vacuum chamber, cathodes arranged in the chamber, disk targets arranged on the bottoms of the cathodes with the bottoms of the targets being flush with a plane, and the filtering frame of the second aspect arranged in the chamber such that normal lines extended from the centers of a pair of the first filter opening and target bottom coincide with each other. According to this arrangement, a surface extended from a given funnel converges at a point and diverges from the point toward an overhead target without intersecting with the overhead target. The "surface extended from a given funnel" forms a first cone starting from the given funnel and then forms an inverted second cone starting from the apex of the first cone. The funnels on the filters are so angled as to catch sputtered particles on the target side of each filter. Namely, no sputtered particles are caught by the bottom face of each filter, and there is no films peeling off the bottoms of the filters.

According to the third aspect, the diameters of the openings may be larger than the diameter of the targets. This arrangement reduces particles to be caught by the filters and increases the number of substrates processible before the particles caught by the filters start to peel off.

According to the third aspect, the cathodes may be fixed to the bottom of a rotatable head. The head may be fixed to the filters. This arrangement rotates the targets and filters to form a uniform film on a substrate.

A fourth aspect of the present invention provides a semiconductor device manufacturing method including the steps of pumping a chamber, introducing argon gas into the chamber, applying power to cathodes to generate argon or metal ion plasma under targets, producing a source flow from particles sputtered from the targets by the plasma, separating a first branch from the source flow through the use of a first filter, the first branch forming a first film on the first filter, separating a second branch from the source flow through the use of a second filter, the second branch forming a second film on the second filter, the thickness of the second film being substantially equal to that of the first film, and directing the source flow passed through openings of the second filter toward a semiconductor substrate to form a third film on the substrate. This method evenly distributes particles caught by the filters among the filters, to increase the number of substrates processible before the particles caught by the filters start to peel off. Namely, the fourth aspect is capable of reducing the washing intervals of the filters.

During the step of depositing the third film on the substrate, the fourth aspect may rotate a head to which the targets and first and second filters are fixed. This may improve the uniformity of the third film.

Other and further objects and features of the present invention will become obvious upon an understanding of the illustrative embodiments about to be described in connection with the accompanying drawings or will be indicated in the appended claims, and various advantages not referred to herein will occur to one skilled in the art upon employing of the invention in practice.

DESCRIPTION OF THE PREFERRED EMBODIMENTS

Figure 1:
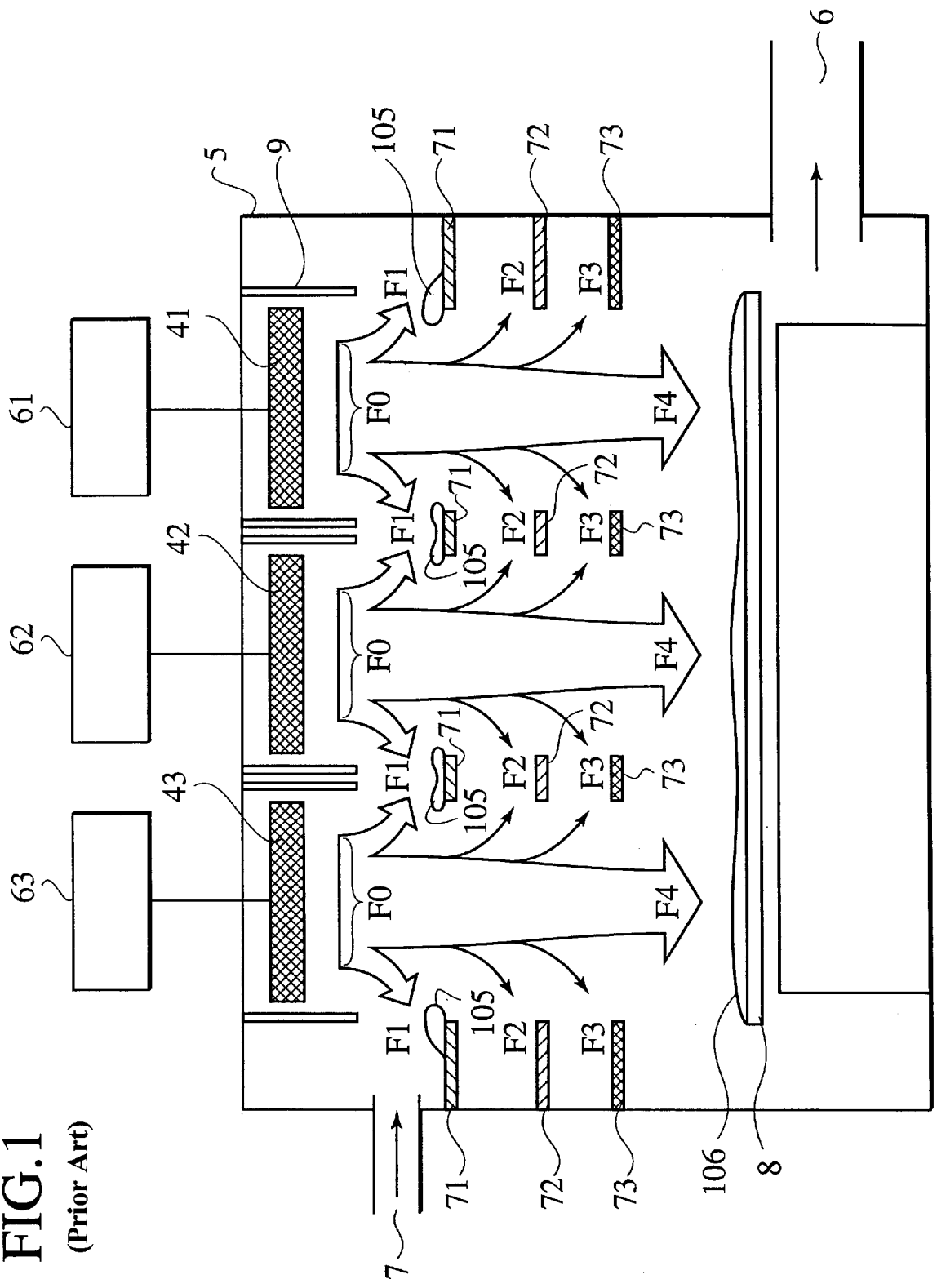
FIG. 1 shows a film forming state by a multicathode sputtering apparatus according to a prior art.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

First Embodiment

Figure 2A:
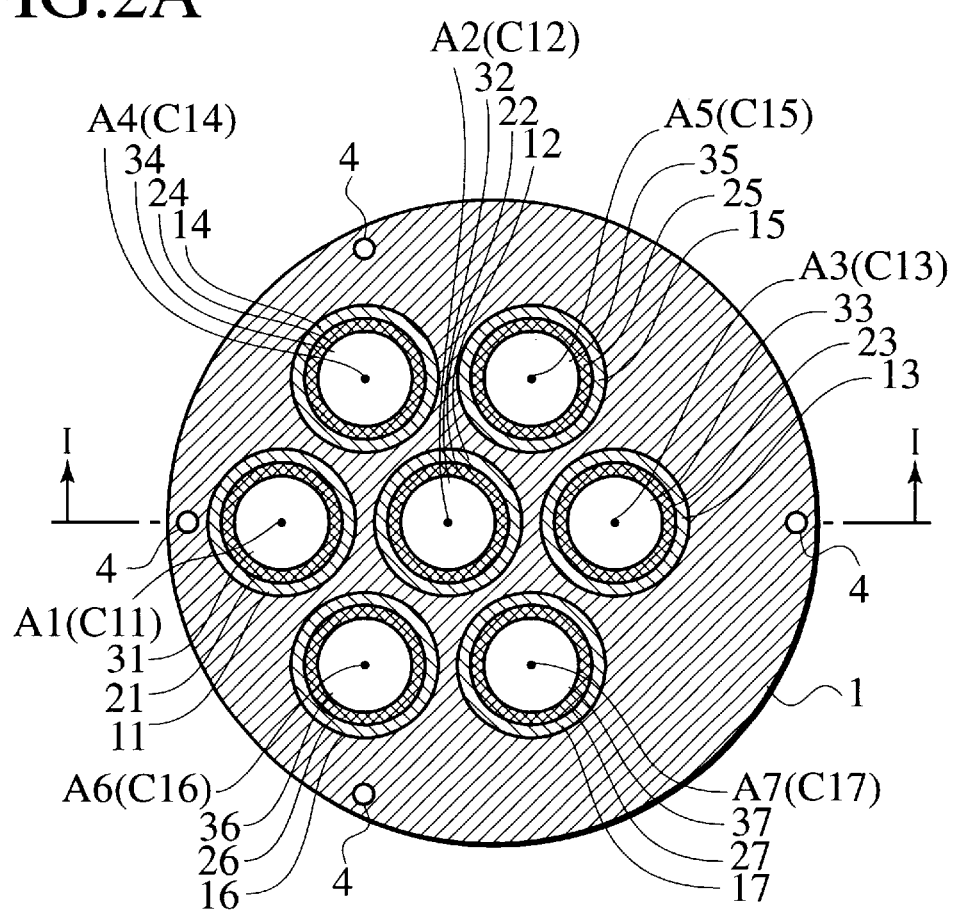
FIGS. 2A and 2B are top and sectional views showing a filtering frame according to a first embodiment of the present invention.
Figure 2B:
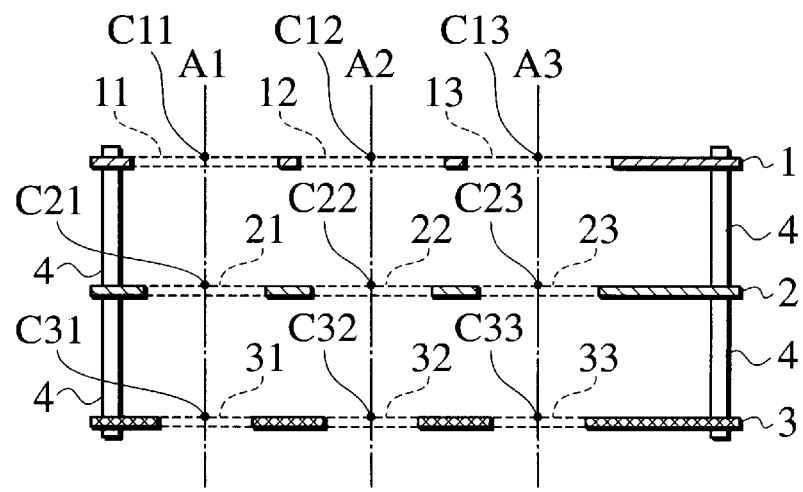

FIG. 2A is a top view showing the structure of a filtering frame according to the first embodiment of the present invention, and FIG. 2B is a sectional view taken along a line I—I of FIG. 2A. The filtering frame has first to third filters 1 to 3, which are supported with spacers 4.

The first filter 1 is a disk having seven circular openings 11 to 17. The openings 11 to 17 have centers C11 to C17, respectively, which are properly distributed from the center of the first filter 1. The openings 11 to 17 have the same diameter, which is 80 mm in this embodiment.

The second filter 2 is a disk having the same diameter as the first filter 1. The second filter 2 has seven circular openings 21 to 27. The second filter 2 is arranged such that a normal line extended from the center thereof coincides with a normal line extended from the center of the first filter 1. The openings 21 to 27 are arranged such that normal lines extended from the centers thereof coincide with normal lines extended from the centers of the openings 11 to 17, respectively. For example, the normal line extended from the center C21 of the opening 21 coincides with the normal line extended from the center C11 of the opening 11. The openings 21 to 27 have the same diameter, which is 75 mm in this embodiment and is smaller than the diameter of the openings 11 to 17.

The third filter 3 is a disk having the same diameter as the first filter 1. The third filter 3 has seven circular openings 31 to 37. The third filter 3 is arranged such that a normal line extended from the center thereof coincides with the normal line extended from the center of the first filter 1. The openings 31 to 37 are arranged such that normal lines extended from the centers thereof coincide with normal lines extended from the centers of the openings 11 to 17, respectively. For example, the normal line extended from the center C31 of the opening 31 coincides with the normal line extended from the center C11 of the opening 11. The openings 31 to 37 have the same diameter, which is 70 mm in this embodiment and is smaller than the diameter of the openings 21 to 27.

Figure 3:
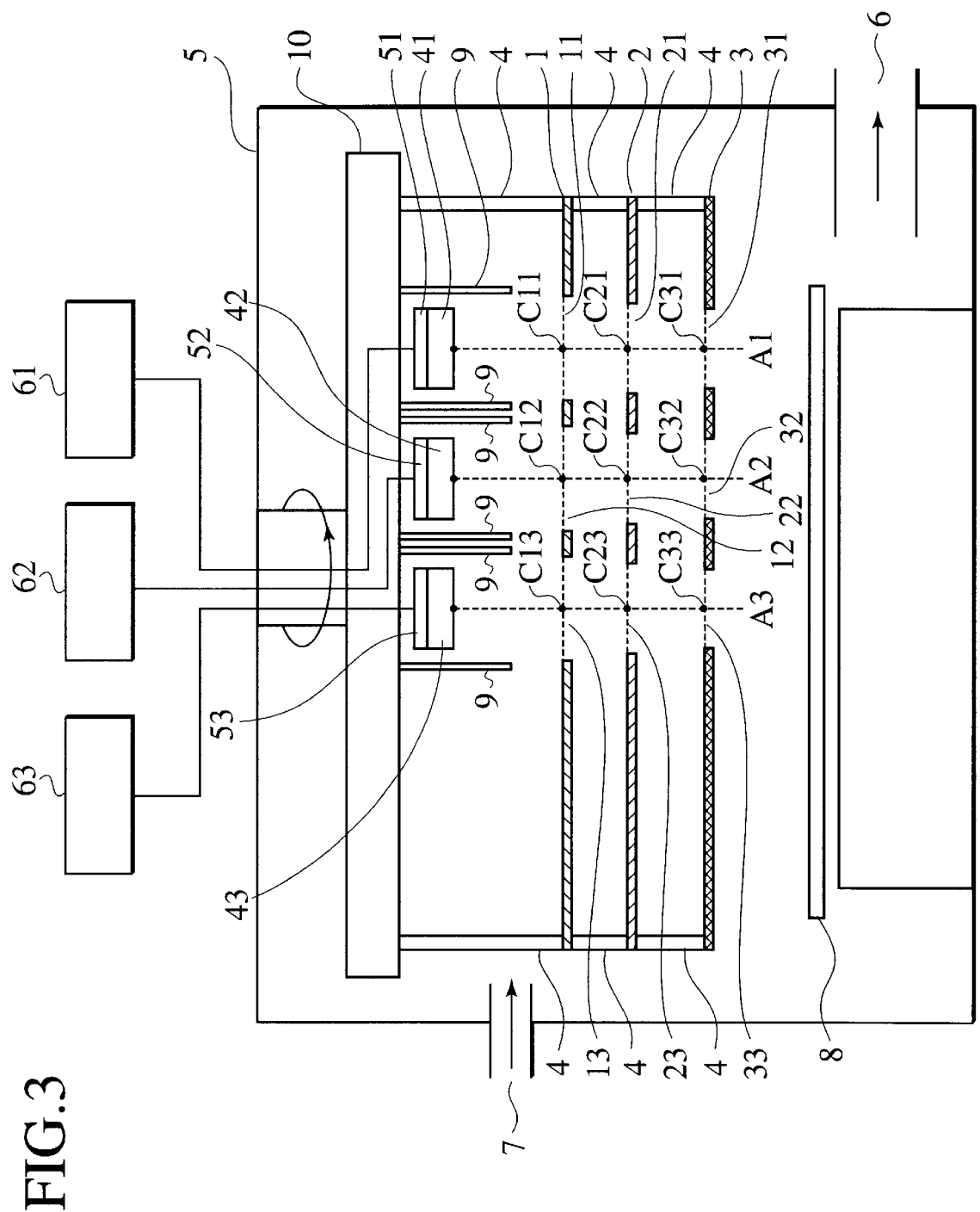
FIG. 3 shows the structure of a multicathode sputtering apparatus according to the first embodiment.

FIG. 3 shows the structure of a multicathode sputtering apparatus according to the first embodiment of the present invention. This apparatus is used to form multiple interconnection layers for semiconductor devices. The apparatus has a chamber 5, which accommodates seven disk cathodes among which three cathodes 51 to 53 are shown in FIG. 3, the remaining two being on this side and the other two on that side of FIG. 3. The cathodes are provided with seven disk targets, respectively, among which three targets 41 to 43 are shown in FIG. 3. The targets are each 60 mm in diameter and are arranged such that the bottoms thereof are flush with a plane. A substrate 8 is arranged in parallel with the bottoms of the targets 41 to 43. The filtering frame of FIGS. 2A and 2B having the first to third filters 1 to 3 are arranged between the targets 41 to 43 and the substrate 8 with the first filter 1 being closest to the targets 41 to 43. The filters 1 to 3 are arranged such that normal lines extended from the centers C11 to C13 of the openings 11 to 13 coincide with normal lines extended from the bottom centers of the targets 41 to 43, respectively. For example, the normal line extended from the center C11 of the opening 11 coincides with the normal line extended from the bottom center of the target 41. Normal lines extended from the centers C14 to C17 of the openings 14 to 17 coincide with normal lines extended from the bottom centers of the remaining four targets, respectively.

The chamber 5 has an outlet 6 connected to a vacuum pump (not shown) and an inlet 7 connected to a gas supply system (not shown) for supplying argon gas. The cathodes 51 to 53 are connected to power sources 61 to 63, respectively, and are fixed to a head 10. The head 10 is fixed to the spacers 4 that support the filters 1 to 3. The head 10 is connected to a rotating mechanism (not shown).

Figure 4:
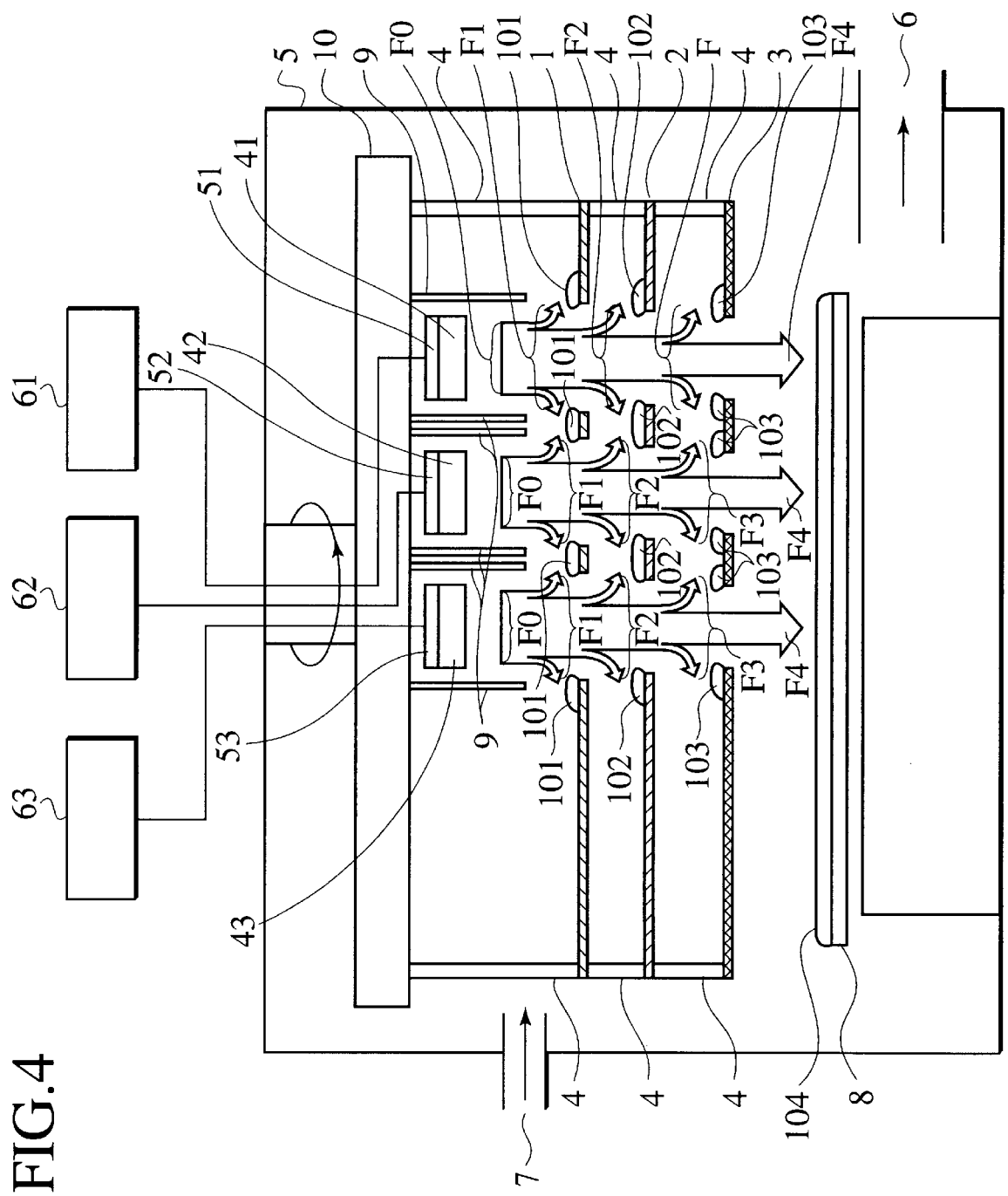
FIG. 4 shows a film forming method according to the first embodiment employing the sputtering apparatus of FIG. 3.

FIG. 4 shows a film forming method according to the first embodiment employing the apparatus of FIG. 3. This method is used to form multiple interconnection layers for semiconductor devices. The method includes the steps of:

(1) pumping the chamber 5 to a pressure of $5 \times 10^{-6}$ Pa with the vacuum pump connected to the outlet 6;

(2) rotating the head 10 at 60 rpm relative to the substrate 8, to rotate the targets 41 to 43 and openings relative to the substrate 8 with the targets 41 to 43 and openings 31 to 33 being spaced from the substrate 8 by predetermined distances;

(3) introducing argon gas into the chamber 5 through the inlet 7 to a pressure of 0.05 Pa;

(4) applying power of 150 W to 350 W from the power sources 61 to 63 to the cathodes 51 to 53, to generate argon plasma under the targets 41 to 43, the power applied to the cathodes 51 to 53 being adjusted to deposit a uniform film 104 on the substrate 8;

(5) sputtering particles from the targets 41 to 43 due to the argon plasma and forming a source flow F0 of the sputtered particles flowing away from each of the targets 41 to 43;

(6) separating a branch F1 from each source flow F0 with the filter 1 set in the source flows F0, to form a film 101 on the filter 1;

(7) passing the remnants of the source flows F0 through the openings 11 to 13 of the filter 1 and separating each branch F2 therefrom with the filter 2 set in the remnants of the source flows F0, to form a film 102 on the filter 2, the filter 2 being positioned to equalize the thickness of the film 102 with that of the film 101;

(8) passing the remnants of the source flows F0 through the openings 21 to 23 of the filter 2 and separating each branch F3 therefrom with the filter 3 set in the remnants of the source flows F0, to form a film 103 on the filter 3, the filter 3 being positioned to equalize the thickness of the film 103 with that of the film 101;

(9) passing the remnants of the source flows F0 through the openings 31 to 33 of the filter 3 and forming each trunk flow F4, to form a film 104 on the substrate 8.

Only vertically oriented particles that can pass through the openings 11 to 13, 21 to 23, and 31 to 33 of the filters 1 to 3 reach the substrate 8 to form the film 104, which involves no ununiformity or asymmetry. Obliquely oriented particles are caught by the filters 1 to 3 and never reach the substrate 8. The openings of the filters 1 to 3 are largest in the vicinities of the cathodes 51 to 53 and are successively reduced toward the substrate 8. The particles caught by the filters 1 to 3 are evenly distributed among them, to increase the number of substrates processible before the films 101 to 103 start to peel off 2.5 times greater than the prior art that employs filters having openings of a single size. The present invention greatly extends the washing intervals of the filters 1 to 3, and improves the uniformity of the film 104 on the substrate 8 to ±3%.

Second Embodiment

Figure 5A:
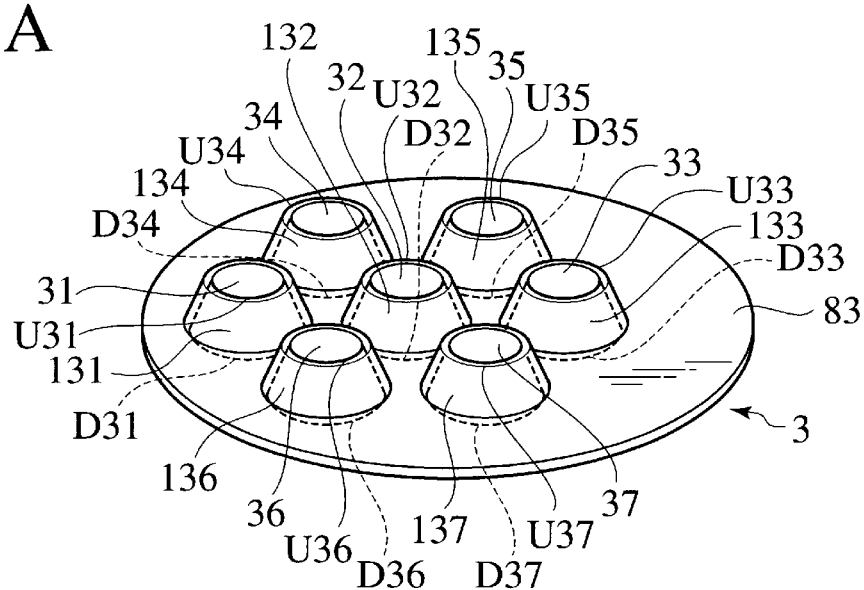
FIGS. 5A to 5C are perspective, top, and sectional views showing a third filter according to a second embodiment of the present invention.
Figure 5B:
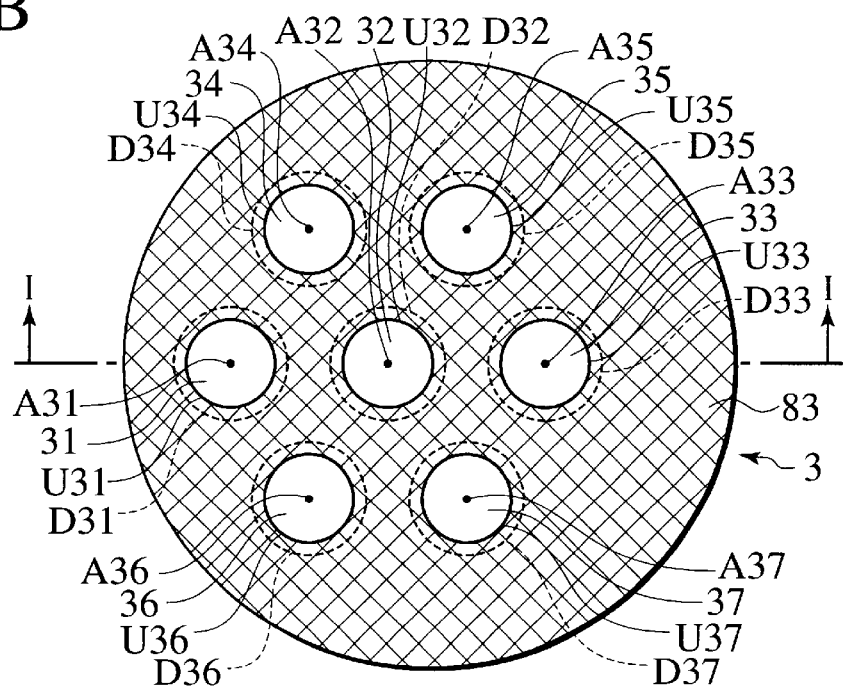
Figure 5C:
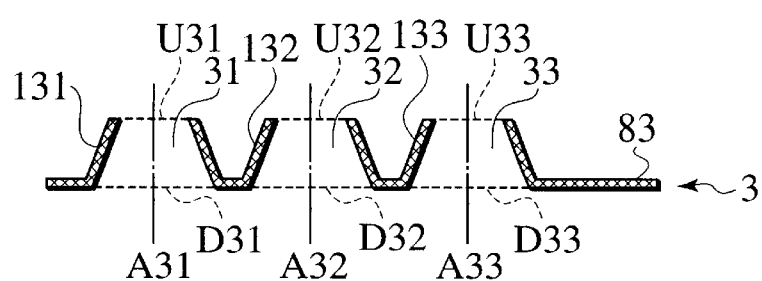

FIG. 5A is a perspective view showing the structure of a third filter 3 according to the second embodiment of the present invention, FIG. 5B is a top view showing the filter 3, and FIG. 5C is a sectional view taken along a line I—I of FIG. 5B. The filter 3 consists of a disk 83 and seven funnels 131 to 137 formed on the disk 83. The structures of the funnels 131 to 137 are identical, and therefore, the details of only the funnel 131 is explained. The funnel 131 has a circular top opening U31 and a circular bottom opening D31. The bottom opening D31 matches with a circular opening formed through the disk 83. The top opening U31 is 70 mm in diameter, which is smaller than the diameter of the bottom opening D31. A normal line extended from the center of the top opening U31 coincides with a normal line extended from the center of the bottom opening D31. The other funnels 132 to 137 have top openings U32 to U37 and bottom openings D32 to D37, respectively. Normal lines extended from the centers of the top openings U31 to U37 are in parallel with one another.

Figure 6A:
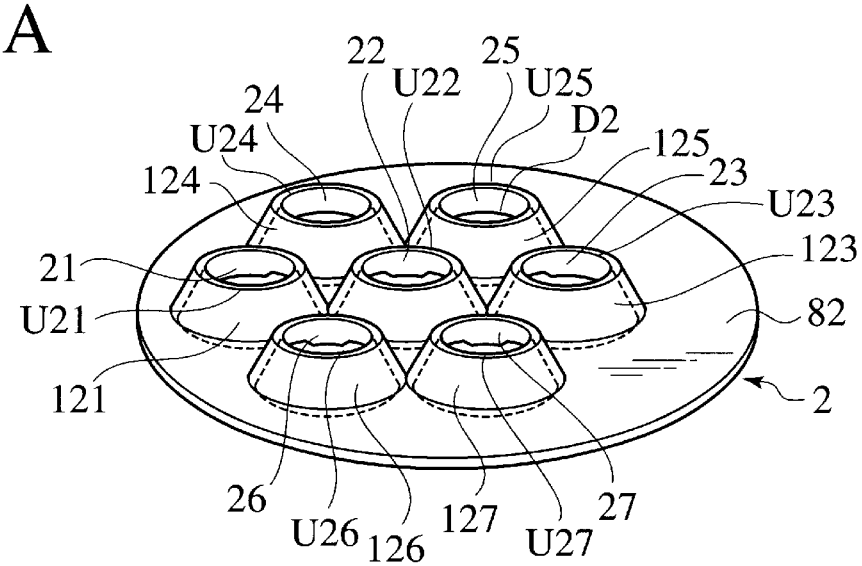
FIGS. 6A to 6C are perspective, top, and sectional views showing a second filter according to the second embodiment.
Figure 6B:
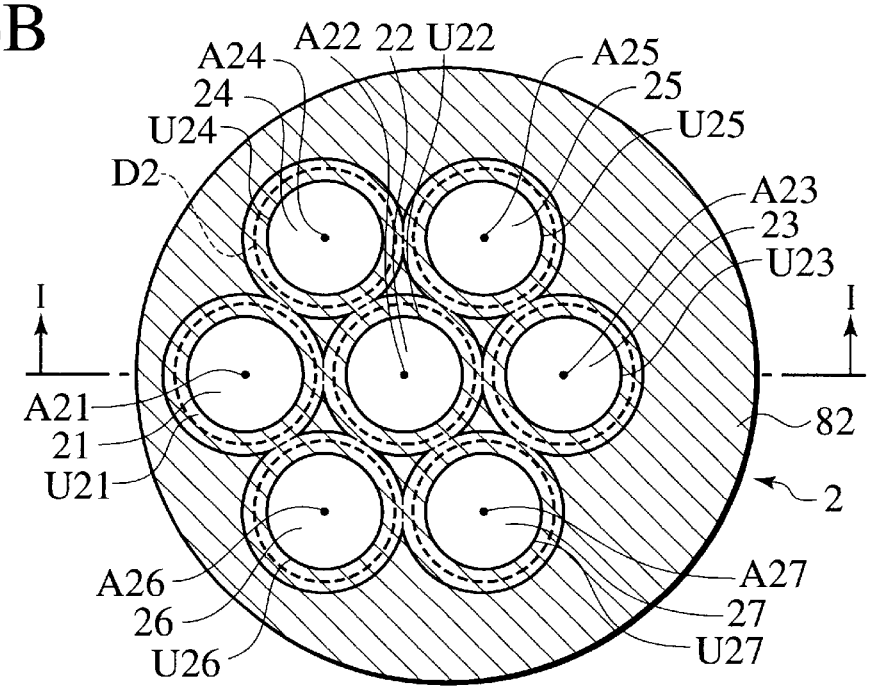
Figure 6C:
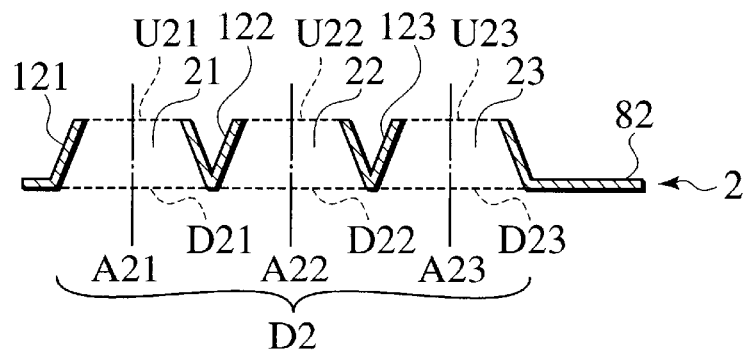

FIG. 6A is a perspective view showing the structure of a second filter 2 according to the second embodiment, FIG. 6B is a top view showing the filter 2, and FIG. 6C is a sectional view taken along a line I—I of FIG. 6B. The filter 2 consists of a disk 82 and seven funnels 121 to 127 formed on the disk 82. The structures of the funnels 121 to 127 are identical, and therefore, the details of only the funnel 121 is explained. The funnel 121 has a circular top opening U21 and a circular bottom opening D21. The bottom opening D21 matches with a circular opening formed through the disk 82. The funnel 121 overlaps the funnels 122, 124, and 126 with the walls of them being in contact with each other. The top opening U21 is 75 mm in diameter, which is smaller than the bottom opening D21 and is larger than the top opening U31 of the filter 3. A normal line extended from the center of the top opening U21 coincides with a normal line extended from the center of the bottom opening D21. The other funnels 122 to 127 have top openings U22 to U27 and bottom openings D22 to D27, respectively. Normal lines extended from the centers of the top openings U21 to U27 are in parallel with one another.

Figure 7A:
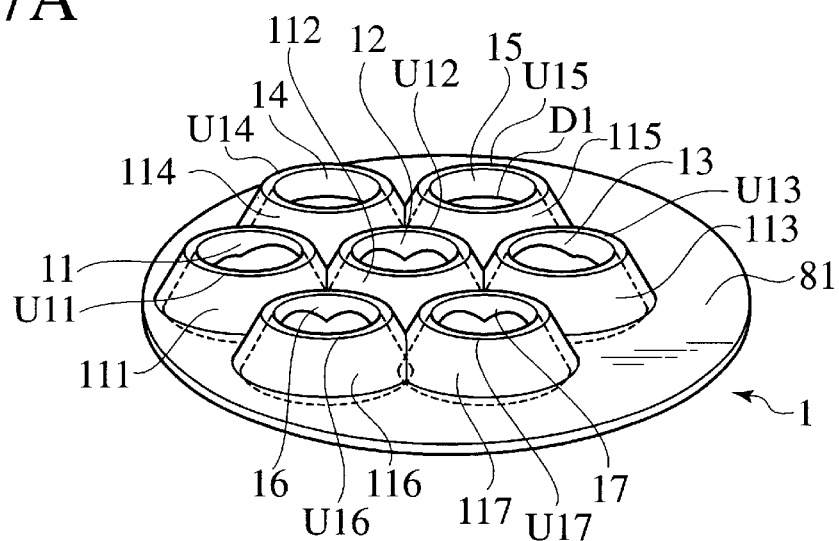
FIGS. 7A to 7C are perspective, top, and sectional views showing a first filter according to the second embodiment.
Figure 7B:
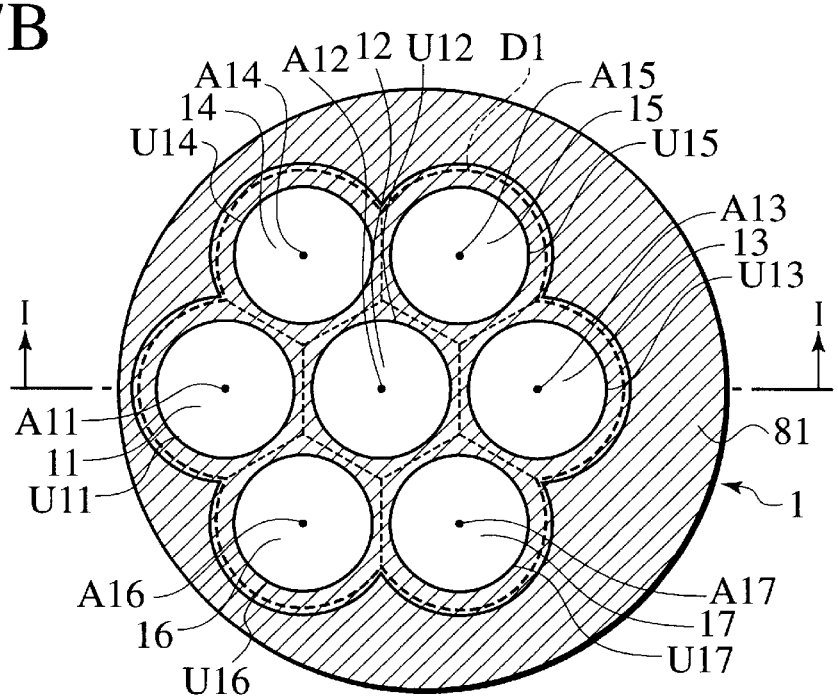
Figure 7C:
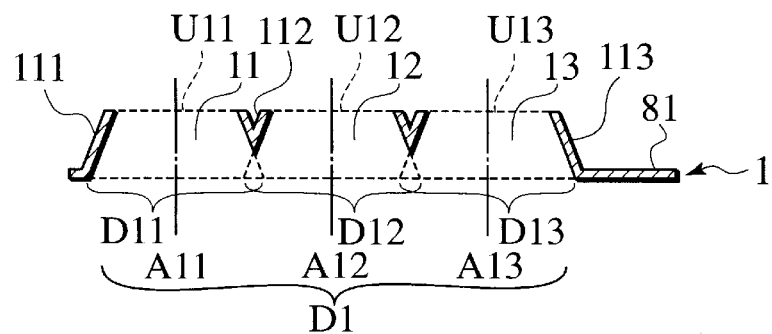

FIG. 7A is a perspective view showing the structure of a first filter 1 according to the second embodiment, FIG. 7B is a top view showing the filter 1, and FIG. 7C is a sectional view taken along a line I—I of FIG. 7B. The filter 1 consists of a disk 81 and seven funnels 111 to 117 formed on the disk 81. The structures of the funnels 111 to 117 are identical, and therefore, the details of only the funnel 111 is explained. The funnel 111 has a circular top opening U11 and a circular bottom opening D11. The bottom opening D11 matches with an opening formed through the disk 81. The funnel 111 overlaps the funnels 112, 114, and 116 with the walls of them being in contact with each other. Parts of the wall of the funnel 111 that enter the funnels 112, 114, and 116 are cut. Parts of the walls of the funnels 112, 114, and 116 that enter the funnel 111 are cut. Consequently, the bottom opening D11 overlaps the bottom openings D12, D14, and D16, to form a collective bottom opening Dl. The top opening U11 is 80 mm in diameter, which is smaller than the bottom opening D11 and is larger than the top opening U21 of the second filter 2. A normal line extended from the center of the top opening U11 coincides with a normal line extended from the center of the bottom opening D11. The other funnels 112 to 117 have top openings U12 to U17 and bottom openings D12 to D17, respectively. Normal lines extended from the centers of the top openings U11 to U17 are in parallel with one another.

Figure 8A:
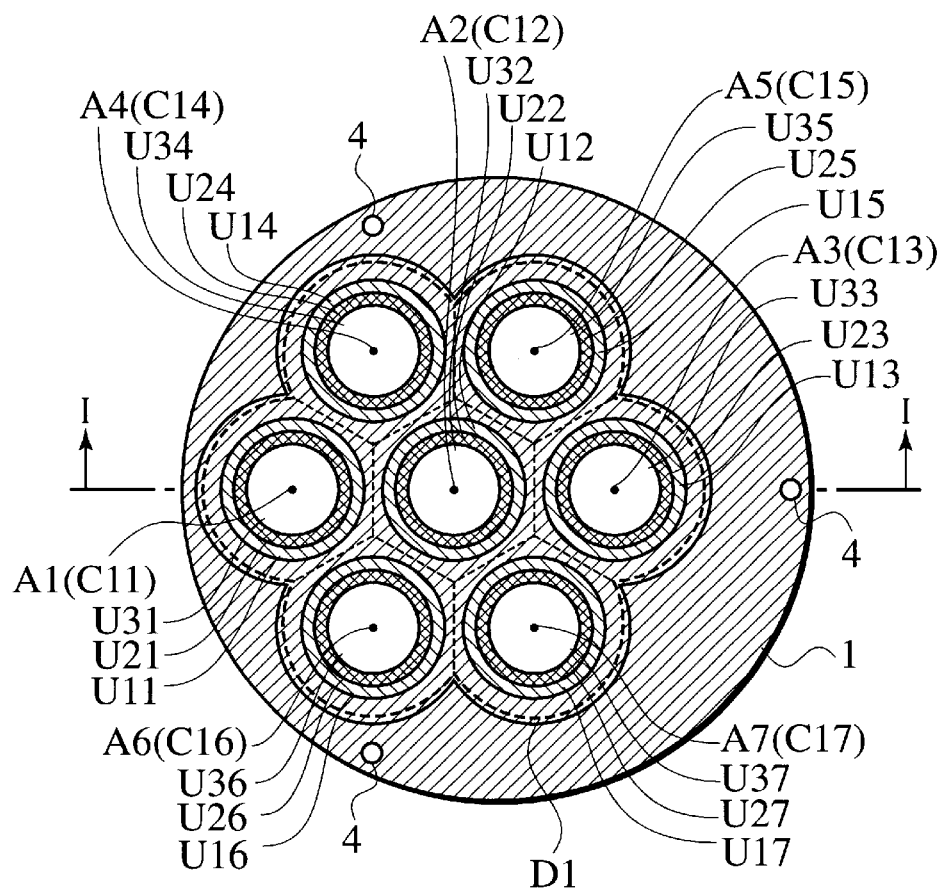
FIGS. 8A and 8B are top and sectional views showing a filtering frame according to the second embodiment.
Figure 8B:
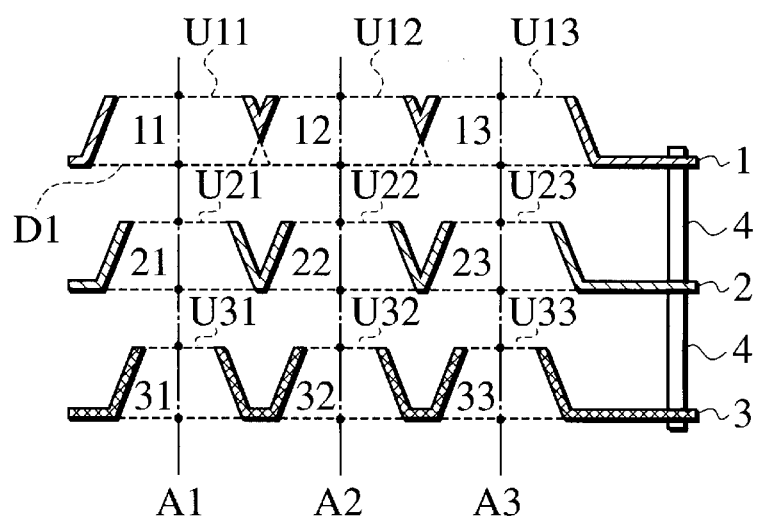

FIG. 8A is a top view showing a filtering frame according to the second embodiment, and FIG. 8B is a sectional view taken along a line I—I. The filtering frame consists of the filter 1 of FIGS. 7A to 7C, the filter 2 of FIGS. 6A to 6C, and the filter 3 of FIGS. 5A to 5C. The filters 1 to 3 are supported with spacers 4. The filters 1 to 3 are arranged such that normal lines extended from the centers of the disks 81 to 83 coincide with one another. The centers C11 to C17 of the top openings U11 to U17 of the funnels 111 to 117, i.e., openings 11 to 17 of the filter 1 are properly distributed with respect to the center of the filter 1.

A normal line extended from the center C21 of the top opening U21 of the funnel 121, i.e., the opening 21 of the filter 2 coincides with a normal line extended from the center C11 of the top opening U11 of the filter 1. The other funnels 122 to 127, i.e., the openings 22 to 27 of the filter 2 are similarly arranged with respect to the top openings U12 to U17 of the filter 1. A normal line extended from the center C31 of the top opening U31 of the funnel 131, i.e., the opening 31 of the filter 3 coincides with the normal line extended from the center C11 of the top opening U11 of the filter 1. The other funnels 132 to 137, i.e., the openings 32 to 37 of the filter 3 are similarly arranged with respect to the top openings U12 to U17 of the filter 1.

Figure 9:
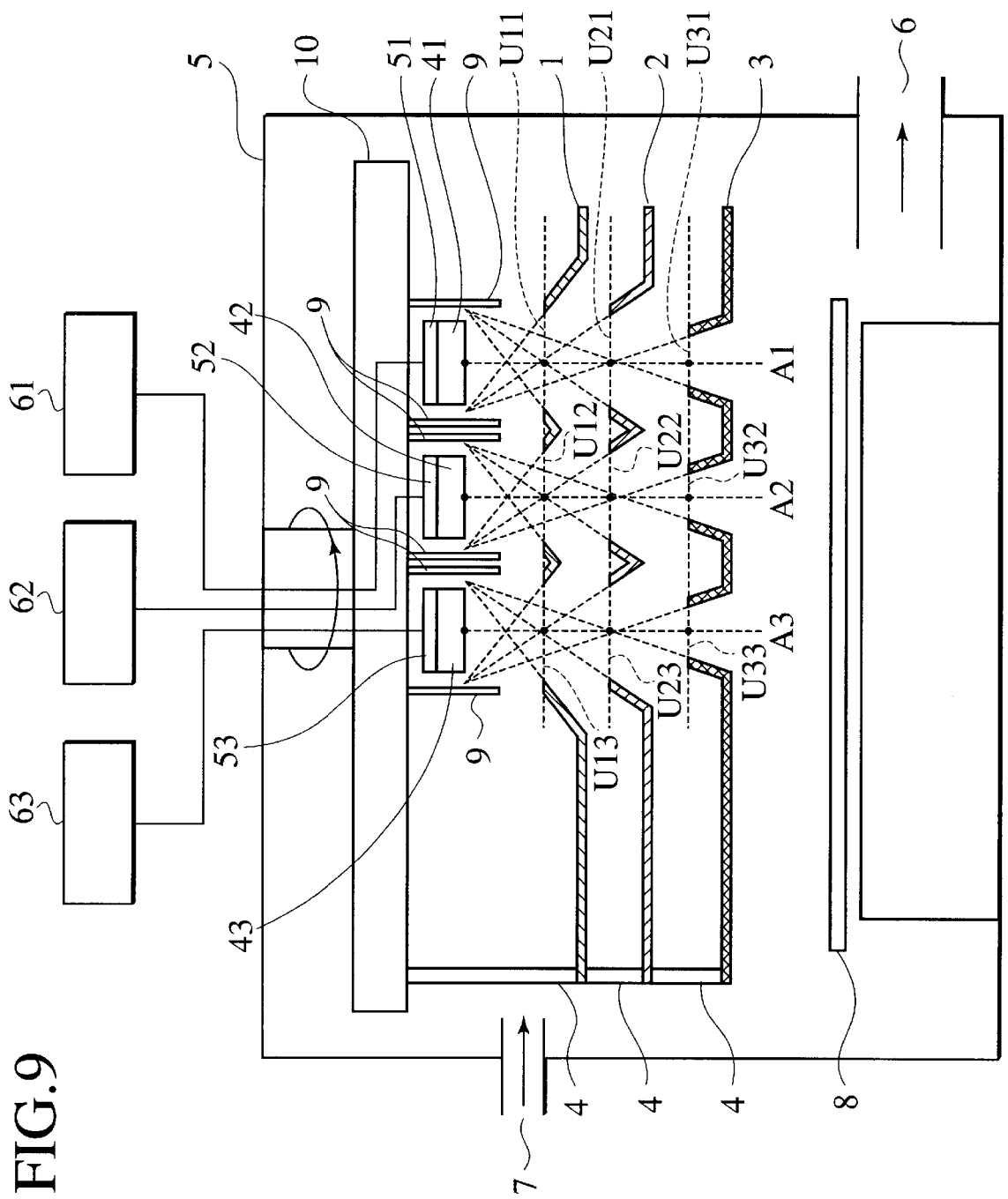
FIG. 9 shows the structure of a multicathode sputtering apparatus according to the second embodiment.

FIG. 9 shows the structure of a multicathode sputtering apparatus according to the second embodiment, for forming interconnection layers for semiconductor devices. This apparatus differs from that of the first embodiment in that it employs the filtering frame of FIGS. 8A and 8B Normal lines extended from the centers C11 to C13 of the top openings U11 to U13 of the filter 1 coincide with normal lines extended from the bottom centers of targets 41 to 43, respectively. For example, the normal line extended from the center C1 of the top opening U11 coincides with the normal line extended from the bottom center of the target 41. The top openings U14 to U17 of the filter 1 are similarly arranged with respect to the other four targets (not shown). The bottoms of the targets are circular. The filters 1 to 3 are arranged such that a surface extended from a given funnel on any one of the filters 1 to 3 converges at a point and diverges from the point toward an overhead target without intersecting with the overhead target.

Figure 10:
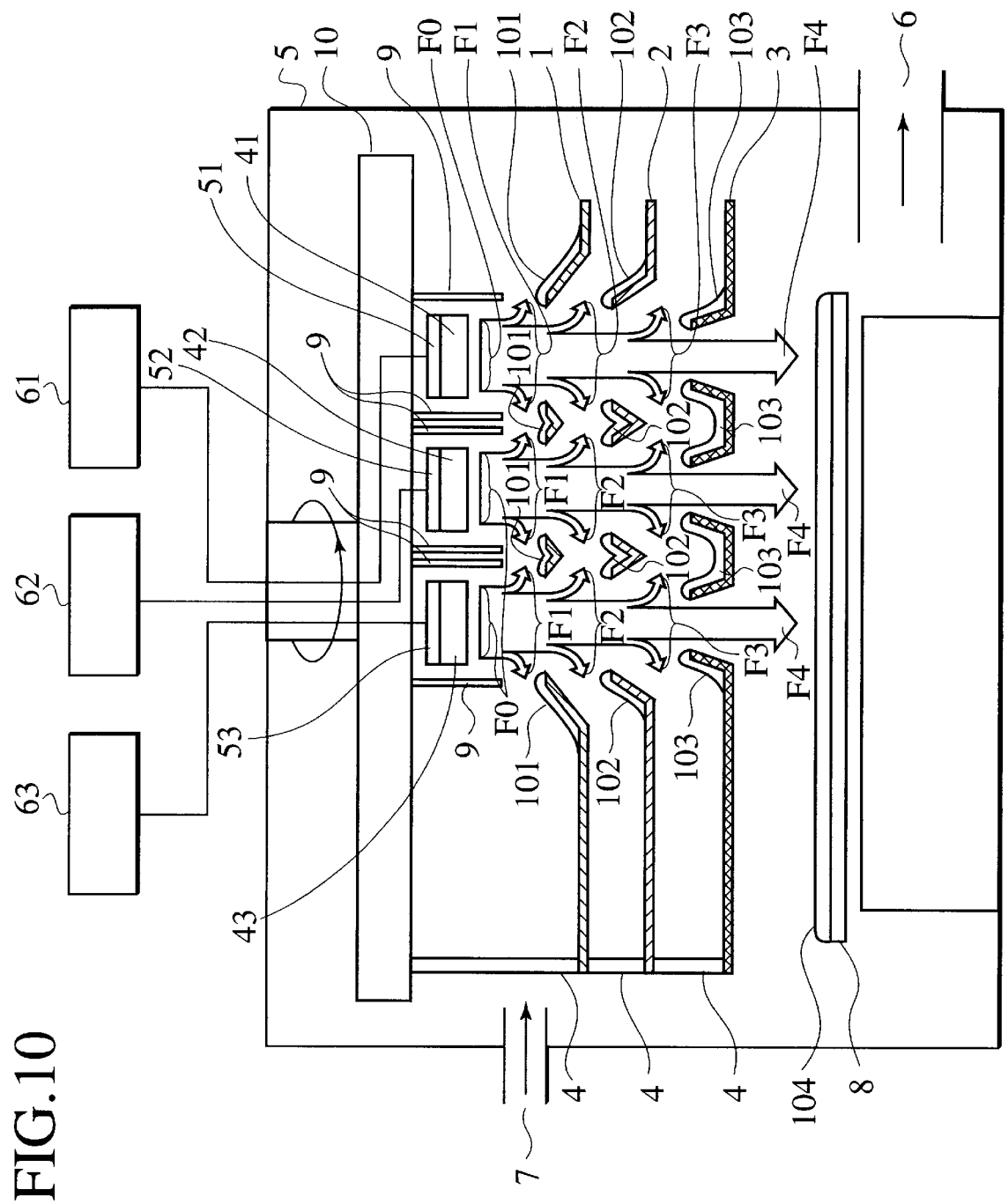
FIG. 10 shows a film forming method according to the second embodiment employing the sputtering apparatus of FIG. 9.

FIG. 10 shows a film forming method according to the second embodiment employing the multicathode sputtering apparatus of FIG. 9. This method is used to form interconnection layers for semiconductor devices. The method includes the steps of pumping a chamber 5, rotating a head 10, introducing argon gas into the chamber 5, applying power to cathodes 51 to 53, producing argon plasma, and generating each source flow F0 of sputtered particles. These steps are the same as those of the first embodiment. Thereafter, the method of the second embodiment carries out the following steps:

(A) The step of separating a branch F1 from each source flow F0 with the filter 1 set in the source flows F0, to form a film 101 on the filter 1.

The film 101 is on each funnel on the filter 1 and spreads in a wider area than in the first embodiment. Namely, the film 101 is distributed into a thin film, to elongate a time to cause the peeling of the film 101, prevent the production of clusters of particles on a substrate 8, and extend the life of the filter 1.

Particles sputtered from the targets 41 to 43 have angles so that they deposit only on the target side of the filter 1 to form the film 101. Namely, no particles deposit on the back face of the filter 1, so that no films peel off the back face of the filter 1. Even if the film 101 peels off the filter 1, the film 101 is unable to go beyond the funnels of the filter 1, and therefore, stays on the filter 1. As a result, no peeled films drop onto the substrate 8.

Each opening of the filter 1 receives particles sputtered from only an overhead target and blocks particles sputtered from adjacent targets. This arrangement improves the directivity of sputtered particles and the uniformity of the film formed on the substrate 8. For each funnel, particles sputtered from the adjacent targets hit the outer face of the funnel at about a right angle, strongly adhere thereto, and hardly peel off.

(B) The step of passing the remnants of the source flows F0 through the openings 11 to 13 of the filter 1 and separating each branch F2 therefrom with the filter 2 set in the remnants of the source flows F0, to form a film 102 on the filter 2.

The filter 2 is positioned so as to equalize the thickness of the film 102 with that of the film 101. The filter 2 provides the same effect as the filter 1.

(C) The step of passing the remnants of the source flows F0 through the openings 21 to 23 of the filter 2 and separating each branch F3 therefrom with the filter 3 set in the remnants of the source flows F0, to form a film 103 on the filter 3.

The filter 3 is positioned so as to equalize the thickness of the film 103 with that of the film 101. The filter 3 provides the same effect as the filter 1.

(D) The step of passing the remnants of the source flows F0 through the openings 31 to 33 of the filter 3 and forming each trunk flow F4, to form a film 104 on the substrate 8.

Only vertically oriented particles that can pass through the openings 11 to 13, 21 to 23, and 31 to 33 of the filters 1 to 3 reach the substrate 8 to form the film 104, which therefore involves no unevenness or asymmetry. The openings of the filters 1 to 3 are largest in the vicinities of the cathodes 51 to 53 and are successively reduced toward the substrate 8. Particles caught by the filters 1 to 3 are evenly distributed among them, to increase the number of substrates processible before the films 101 to 103 start to peel off 2.5 times greater than the prior art that employs openings of a single size. The present invention greatly extends the washing intervals of the filters 1 to 3 and improves the uniformity of the film 104 to ±3%.

Although each opening on the filters of the embodiments is circular, it may have any shape to meet the bottom shape of a target. The number of openings on each filter as well as the number of filters are not limited to seven and three, respectively. The numbers may be two or more.

In summary, the present invention provides a filter capable of minimizing the thickness of a film depositing thereon and preventing peeled films from dropping onto a substrate.

The present invention also provides a filtering frame capable of minimizing the thickness of a film depositing on each filter and preventing peeled films from dropping onto a substrate.

The present invention also provides a semiconductor device manufacturing apparatus capable of minimizing the thickness of a film depositing on each filter and preventing peeled films from dropping onto a substrate.

The present invention also provides a semiconductor device manufacturing method capable of minimizing the thickness of a film depositing on each filter.

The present invention reduces the washing intervals of each filter and improves the productivity of semiconductor devices.

Various modifications will become possible for those skilled in the art after receiving the teachings of the present disclosure without departing from the scope thereof.

What is claimed is:

1. A filter for action of particles of a target to a substrate comprising:

a flat plate having circular plate opening; and a funnel provided for the plate opening, having a bottom opening matching with the plate opening and a top opening smaller than the bottom opening, a normal line extended from the center of the top opening coinciding with a normal line extended from the center of the bottom opening and being in parallel with a normal line extended from said flat plate, and having a surface converging at a point and being able to diverge from the point without intersecting with the target in extending.

2. The filter of claim 1, wherein:

the flat plate is a flat disk.

3. A filtering frame for action of particles of a target to a substrate comprising:

a first plate, being able to be arranged between the target and the substrate, having a first circular opening a number of which is equal to a number of an arranged capacity of the target, a normal line extended from a center of the first circular opening being able to coincide with a normal line extended from a bottom center of the target;

a second plate, being able to be arranged between said first plate and the substrate, having a second circular opening smaller than the first circular opening, respectively, normal lines extended from the centers of a pair of the first and second circular openings coinciding with each other;

a first funnel arranged on the first plate for the first circular opening, having a first bottom opening matching with the first circular opening and a first top opening smaller than the first bottom opening, a normal line extended from the center of the first top opening coinciding with a normal line extended from the center of the first bottom opening; and a second funnel arranged on the second plate for the second circular opening, having a second bottom opening matching with the second circular opening and a second top opening smaller than the second bottom opening and the first top opening, a normal line extended from the center of the second top opening, a normal line extended from the center of the second bottom opening, and a normal line extended from the center of the corresponding first top opening coinciding with one another.

4. A filtering frame for action of particles of targets to a substrate comprising:

a first plate, being able to be arranged between the targets and the substrate, having first circular openings a number of which is equal to a number of an arranged capacity of the targets, normal lines extended from centers of the first circular openings being able to coincide with normal lines extended from bottom centers of the targets respectively;

a second plate, being able to be arranged between said first plate and the substrate, having second circular openings smaller than the first circular openings, respectively, normal lines extended from the centers of a corresponding pair of the first and second circular openings coinciding with each other;

a first funnel arranged on the first plate for the first circular opening, having a first bottom opening matching with the first circular opening and a first top opening smaller than the first bottom opening, a normal line extended from the center of the first top opening coinciding with a normal line extended from the center of the first bottom opening, and the first bottom openings and the walls of adjacent ones of the first funnels partly overlap one another, and the overlapping parts of the walls of the first funnels are cut; and a second funnel arranged on the second plate for the second circular openings, having a second bottom opening matching with the second circular opening and a second top opening smaller than the second bottom opening and the first top opening, a normal line extended from the center of the second top opening, a normal line extended from the center of the second bottom opening, and a normal line extended from the corresponding first top opening coinciding with one another.

5. The filter of claim 1, wherein a number of the plate opening is plural.

6. The filter of claim 5, wherein, the bottom openings and walls of adjacent ones of the funnels partly overlap one another, and the overlapping parts of the walls of the funnels are cut.

* * * * *